(12) United States Patent
Jo et al.

(10) Patent No.: US 11,063,244 B2
(45) Date of Patent: Jul. 13, 2021

(54) ELECTROLUMINESCENT DISPLAY DEVICE

(71) Applicant: LG Display Co., Ltd., Seoul (KR)

(72) Inventors: So-Young Jo, Paju-si (KR); Ji-Hyang Jang, Paju-si (KR); Min-Geun Choi, Paju-si (KR); Woo-Ram Youn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/197,059

(22) Filed: Nov. 20, 2018

(65) Prior Publication Data

US 2019/0165323 A1 May 30, 2019

(30) Foreign Application Priority Data

Nov. 30, 2017 (KR) .................. 10-2017-0163169

(51) Int. Cl.
*H01L 51/52* (2006.01)
*H01L 27/32* (2006.01)
*H01L 51/50* (2006.01)

(52) U.S. Cl.
CPC ........ *H01L 51/5275* (2013.01); *H01L 27/322* (2013.01); *H01L 27/3246* (2013.01); *H01L 27/3258* (2013.01); *H01L 51/5206* (2013.01); *H01L 51/5209* (2013.01);
(Continued)

(58) Field of Classification Search
CPC ............... H01L 51/5275; H01L 27/322; H01L 27/3246; H01L 27/3258; H01L 51/5206; H01L 51/5209; H01L 51/5221; H01L 51/5225; H01L 51/502; H01L 2251/558
See application file for complete search history.

(56) References Cited

U.S. PATENT DOCUMENTS

2004/0156604 A1* 8/2004 Ino .................. G02F 1/136213
385/114
2006/0238673 A1 10/2006 Roh
(Continued)

FOREIGN PATENT DOCUMENTS

CN 1413069 A 4/2003
CN 1575056 A 2/2005
(Continued)

*Primary Examiner* — Fernando L Toledo
*Assistant Examiner* — Neil R Prasad
(74) *Attorney, Agent, or Firm* — Seed IP Law Group LLP

(57) ABSTRACT

An electroluminescent display device comprises a substrate; a thin film transistor disposed on the substrate; an overcoat layer disposed on the thin film transistor; and a light-emitting diode electrically connected to the thin film transistor through the overcoat layer, wherein the light-emitting diode includes a first electrode, a light-emitting layer on the first electrode and a second electrode on the light-emitting layer, and an emissive area is an area in which the light-emitting layer emits light by the first electrode or the second electrode, wherein the overcoat layer includes a micro lens at a position corresponding to the emissive area, and the light-emitting diode conforms to a morphology of the micro lens, and wherein the first electrode includes a first region and a second region, the first region comprises an electrode layer, and the second region includes the electrode layer and an electrode pattern disposed under the electrode layer.

20 Claims, 6 Drawing Sheets

(52) U.S. Cl.
CPC ...... *H01L 51/5221* (2013.01); *H01L 51/5225* (2013.01); *H01L 51/502* (2013.01); *H01L 2251/558* (2013.01)

(56) References Cited

U.S. PATENT DOCUMENTS

| | | | |
|---|---|---|---|
| 2007/0019137 A1* | 1/2007 | Kim | G02F 1/1341 349/114 |
| 2008/0024402 A1* | 1/2008 | Nishikawa | H01L 51/5209 345/82 |
| 2014/0346449 A1* | 11/2014 | Choi | H01L 27/3211 257/40 |
| 2015/0380466 A1* | 12/2015 | Koo | H01L 27/3258 257/40 |
| 2017/0062770 A1* | 3/2017 | Jang | H01L 51/5271 |
| 2017/0155094 A1 | 6/2017 | Joung et al. | |

FOREIGN PATENT DOCUMENTS

| | | |
|---|---|---|
| CN | 1612659 A | 5/2005 |
| CN | 106816454 A | 6/2017 |
| KR | 10-0937867 B1 | 1/2010 |
| TW | 200605722 A | 2/2006 |
| TW | 200711181 A | 3/2007 |
| TW | 201511333 A | 3/2015 |

\* cited by examiner

| Thickness of first electrode (Å) | Driving voltage (V) | Current-luminance efficiency (cd/A) | External quantum efficiency (%) | Color temperature (K) |
|---|---|---|---|---|
| 250 | 10.8 | 116.3 | 48 | 6782 |
| 300 | 10.7 | 114.9 | 47.2 | 6965 |
| 400 | 10.6 | 109.8 | 45.2 | 7018 |

| Thickness of first electrode (Å) | Driving voltage (V) | Current-luminance efficiency (cd/A) | External quantum efficiency (%) | Color temperature (K) |
|---|---|---|---|---|
| ~~250~~ | ~~10.8~~ | ~~116.3~~ | ~~48~~ | ~~6982~~ |
| 300 | 10.7 | 114.9 | 47.2 | 6965 |
| 400 | 10.6 | 109.8 | 45.2 | 7018 |

ELECTROLUMINESCENT DISPLAY DEVICE

CROSS-REFERENCE TO RELATED APPLICATIONS

This application claims the benefit under 35 U.S.C. § 119(a) of Korean Patent Application No. 2017-0163169, filed Nov. 30, 2017, in the Korean Intellectual Property Office, which is incorporated herein by reference in its entirety.

BACKGROUND

Technical Field

The present disclosure relates to an electroluminescent display device, and more particularly, to an electroluminescent display device capable of improving light extraction efficiency and reliability.

Description of the Related Art

In recent years, flat panel displays having excellent characteristics such as being thin, lightweight, and having low power consumption have been widely developed and applied to various fields.

Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed, and then radiative recombination of the excitons occurs, thereby emitting light.

The electroluminescent display device can be formed using a flexible substrate such as plastic because it is self-luminous, and has excellent contrast ratios. Further the electroluminescent display device has a response time of several micro seconds, and there are advantages in displaying moving images. The electroluminescent display device also has wide viewing angles and is stable under low temperatures. Since the electroluminescent display device is driven by a low voltage of direct current DC 5V to 15V, it is easy to design and manufacture driving circuits.

FIG. 1 is a schematic cross-sectional view of a related art electroluminescent display device.

As illustrated in FIG. 1, an electroluminescent display device 1 includes a substrate 10, a thin film transistor Tr disposed on the substrate 10, a light-emitting diode D disposed on the substrate 10 and connected to the thin film transistor Tr, and a color filter pattern 50 under the light-emitting diode D. An encapsulation layer (not shown) may be disposed on the light-emitting diode D.

The light-emitting diode D includes a first electrode 41, a light-emitting layer 42, and a second electrode 43, wherein light from the light-emitting layer 42 is output to the outside through the first electrode 41.

The light emitted from the light-emitting layer 42 passes through various configurations of the electroluminescent display device 1 and exits the electroluminescent display device 1.

However, an optical waveguide mode which is configured by a surface plasmon component generated at a boundary between a metal and the light-emitting layer 42 and the light-emitting layer 42 inserted between reflective layers at both sides accounts for about 60 to 70% of emitted light.

Accordingly, among light emitted from the light-emitting layer 42, rays of light that are trapped in the electroluminescent display device 1 instead of exiting the electroluminescent display device 1 are present. Thus, there is a problem in that light extraction efficiency of the electroluminescent display device 1 is degraded.

BRIEF SUMMARY

Accordingly, embodiments of the present disclosure are directed to an electroluminescent display device that substantially obviates one or more of the problems due to limitations and disadvantages of the related art.

It is an object of the present disclosure to provide an electroluminescent display device with improved light extraction efficiency and reliability through an overcoat layer having a micro lens and a first electrode including a first thickness and a second thickness which is greater than the first thickness.

To achieve the above-described object, the present disclosure provides an electroluminescent display device comprises; a thin film transistor disposed on the substrate; an overcoat layer disposed on the thin film transistor; and a light-emitting diode electrically connected to the thin film transistor through the overcoat layer, wherein the light-emitting diode includes a first electrode, a light-emitting layer on the first electrode and a second electrode on the light-emitting layer, and an emissive area is an area in which the light-emitting layer emits light by the first electrode or the second electrode, wherein the overcoat layer includes a micro lens at a position corresponding to the emissive area, and the light-emitting diode conforms to a morphology of the micro lens, and wherein the first electrode includes a first region and a second region, the first region comprises an electrode layer, and the second region includes the electrode layer and an electrode pattern disposed under the electrode layer.

According to one embodiment, an electroluminescent display device is disclosed. The electroluminescent display device comprises a substrate; a thin film transistor disposed on the substrate; an overcoat layer disposed on the thin film transistor; and a light-emitting diode electrically connected to the thin film transistor through the overcoat layer, wherein the light-emitting diode includes a first electrode, a light-emitting layer on the first electrode and a second electrode on the light-emitting layer, and an emissive area is an area in which the light-emitting layer emits light by the first electrode or the second electrode, wherein the overcoat layer includes a micro lens at a position corresponding to the emissive area, and the light-emitting diode conforms to a morphology of the micro lens, wherein the first electrode includes a first region having a first thickness and a second region having a second thickness larger than the first thickness, and wherein the micro lens includes a plurality of protruding portions and a plurality of depressed portions, a range from a central point of one depressed portion to a central point of another depressed portion adjacent thereto is one individual pattern of the micro lens, and the first region and the second region are alternately disposed for each or several individual patterns.

It is to be understood that both the foregoing general description and the following detailed description are by example and explanatory, and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain various principles of the present disclosure. In the drawings.

DETAILED DESCRIPTION

Hereinafter, exemplary embodiments of the present disclosure will be described with reference to the accompanying drawings.

First Embodiment

Figure 1:
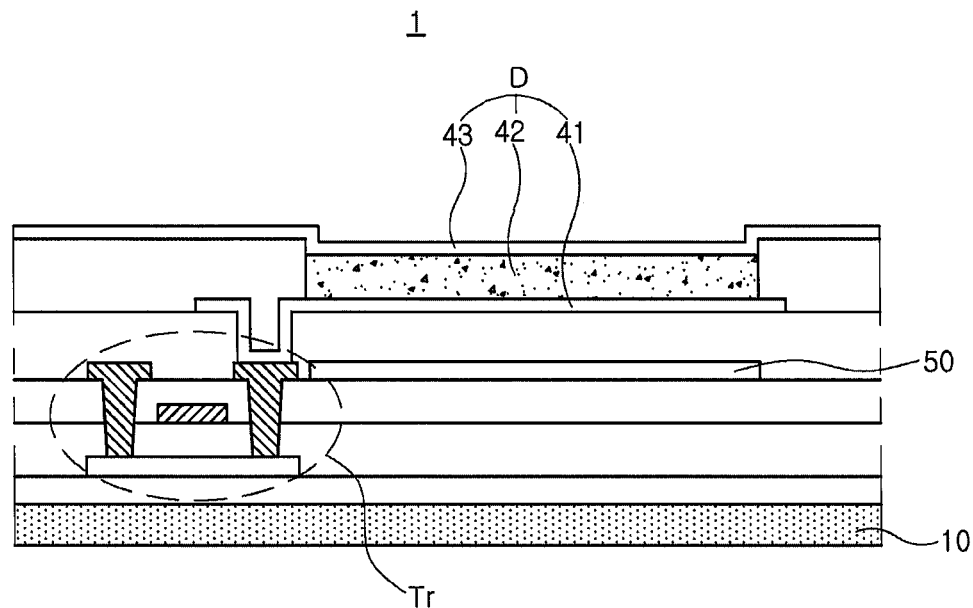
FIG. 1 is a cross-sectional view schematically illustrating a conventional electroluminescent display device.
Figure 2:
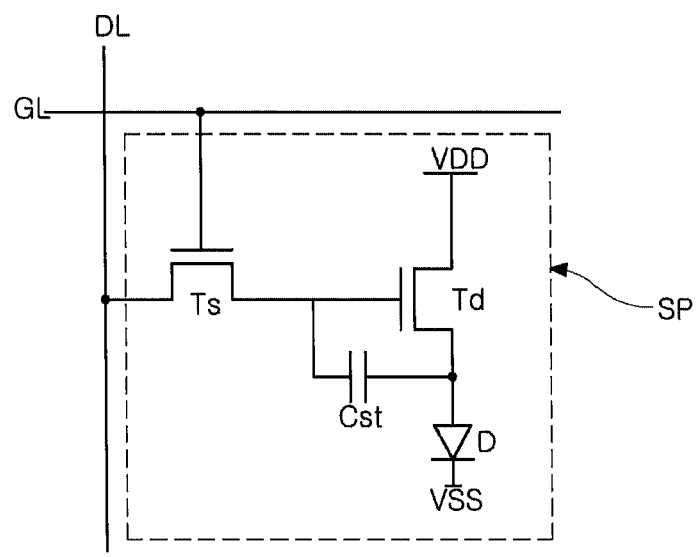
FIG. 2 is a circuit diagram illustrating a single subpixel area of an electroluminescent display device according to an embodiment of the present disclosure.

FIG. 2 is a circuit diagram illustrating a subpixel area of an electroluminescent display device according to an embodiment of the present disclosure.

As illustrated in FIG. 2, the electroluminescent display device according to the embodiment of the present disclosure includes a gate line GL, a data line DL, a switching thin film transistor Ts, a driving thin film transistor Td, a storage capacitor Cst and a light-emitting diode D. The gate line GL and the data line DL cross each other to define a subpixel area SP. The switching thin film transistor Ts, the driving thin film transistor Td, the storage capacitor Cst and the light-emitting diode D are formed in the subpixel area SP.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light-emitting diode D is connected to a drain electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

That is, the amount of the current flowing through the light-emitting diode D is proportional to the magnitude of the data signal, and the intensity of light emitted by the light-emitting diode D is proportional to the amount of the current flowing through the light-emitting diode D. Thus, subpixel areas SP show different gray levels depending on the magnitude of the data signal, and as a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame.

A transistor and/or a capacitor other than the switching and driving thin film transistors Ts and Td and the storage capacitor Cst may be further added in the subpixel area SP.

Figure 3:
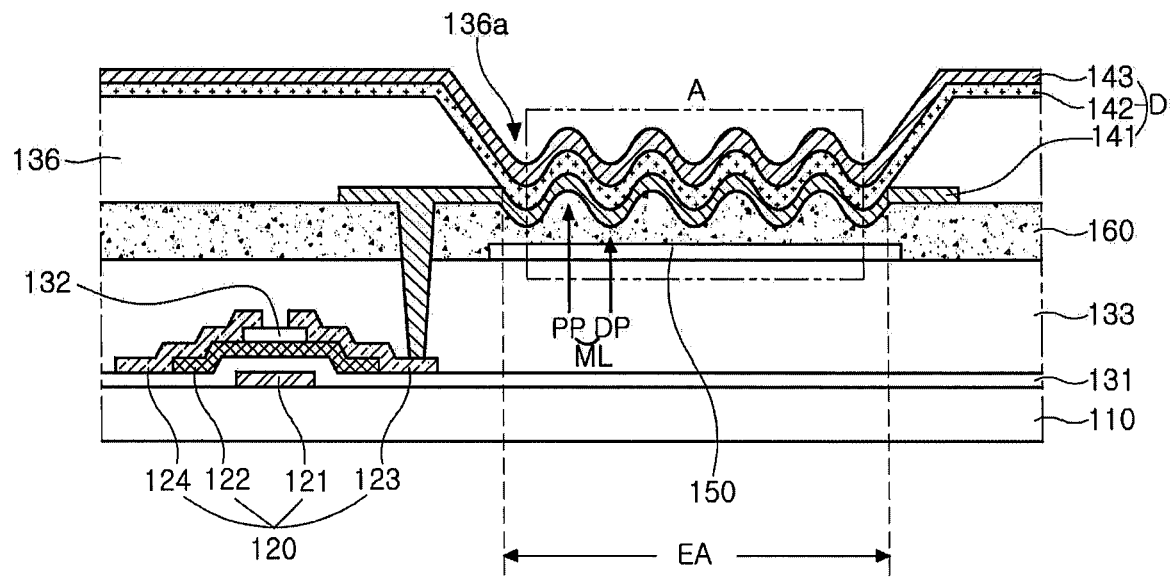
FIG. 3 is a cross-sectional view schematically illustrating an electroluminescent display device according to a first embodiment of the present disclosure.
Figure 4:
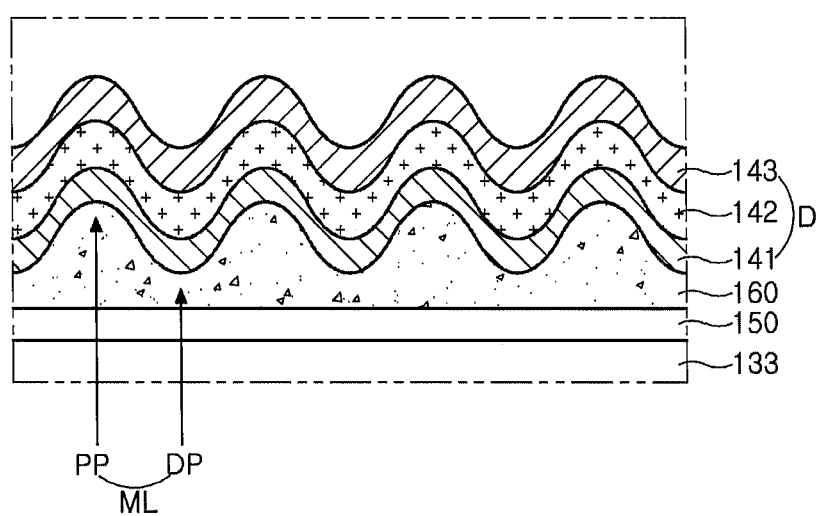
FIG. 4 is an enlarged view of portion A of FIG. 3.

FIG. 3 is a cross-sectional view schematically illustrating an electroluminescent display device according to a first embodiment of the present disclosure, and FIG. 4 is an enlarged view of portion A of FIG. 3.

As illustrated in FIG. 3, an electroluminescent display device 100 according to the first embodiment of the present disclosure includes a substrate 110, a thin film transistor 120, a color filter pattern 150, an overcoat layer 160, and a light-emitting diode D electrically connected to the thin film transistor 120.

The electroluminescent display device 100 according to the first embodiment of the present disclosure is illustrated as being a bottom emission type in which light from a light-emitting layer 142 is output to the outside through a first electrode 141, but embodiments are not limited thereto.

That is, the electroluminescent display device 100 according to the first embodiment of the present disclosure may also be a top emission type in which the color filter pattern 150 is disposed opposite the substrate 110 (above the light-emitting diode D), and light from the light-emitting layer 142 is output to the outside through a second electrode 143.

When the electroluminescent display device 100 is the top emission type, a reflective electrode or a reflective layer may be further formed below the first electrode 141. For example, the reflective electrode or the reflective layer may be formed of an aluminum-palladium-copper (APC) alloy. In this case, the second electrode 143 may have a relatively thin thickness for light to transmit there through.

The electroluminescent display device 100 according to the first embodiment of the present disclosure may include, on the substrate 110, a thin film transistor 120 which includes a gate electrode 121, an active layer 122, a source electrode 123, and a drain electrode 124.

Specifically, the gate electrode 121 of the thin film transistor 120 and a gate insulating layer 131 may be disposed on the substrate 110.

The active layer 122 which overlaps the gate electrode 121 may be disposed on the gate insulating layer 131.

An etch stopper 132 for protecting a channel region of the active layer 122 may be disposed on the active layer 122.

The source electrode 123 and the drain electrode 124 may be disposed on the active layer 122 and contact the active layer 122.

The electroluminescent display device 100 to which the first embodiment of the present disclosure is applicable is not limited to that illustrated in FIG. 3. The electroluminescent display device 100 may further include a buffer layer disposed between the substrate 110 and the active layer 122, and the etch stopper 132 may not be disposed thereon.

For convenience of description, only the driving thin film transistor has been illustrated from among various thin film transistors that may be included in the electroluminescent display device 100. In the figure, although the thin film transistors 120 has an inverted staggered structure or bottom gate structure in which the gate electrode 121 is disposed at an opposite side of the source electrode 123 and the drain electrode 124 with respect to the active layer 122, this is merely an example, and a thin film transistor, which has a coplanar structure or top gate structure in which the gate electrode 121 is disposed at the same side as the source electrode 123 and the drain electrode 124 with respect to the active layer 122, may also be used.

A passivation layer 133 may be disposed on the drain electrode 124 and the source electrode 123, and the color filter pattern 150 may be disposed on the passivation layer 133.

In this case, although the passivation layer 133 acts as a planarizing layer over an upper portion of the thin film transistor 120, the passivation layer 133 may also be disposed to conform to the shapes of surfaces of elements located below the passivation layer 133 instead of acting as a planarizing layer over the upper portion of the thin film transistor 120.

The color filter pattern 150 is configured to change a color of light emitted from the light-emitting layer 142 and may be one of a red color filter pattern, a green color filter pattern, and a blue color filter pattern.

The color filter pattern 150 may be disposed at positions which correspond to an emissive area EA on the passivation layer 133 and may be disposed only in some portions of the emissive area EA.

Emissive area EA refers to an area in which the light-emitting layer 142 emits light by the first electrode 141 and the second electrode 143, and the color filter pattern 150 being disposed on a position corresponding to the emissive area EA means that the color filter pattern 150 is disposed to prevent a blurring phenomenon and a ghost phenomenon which occur due to mixing of light emitted from adjacent emissive areas EA.

For example, the color filter pattern 150 may be disposed to overlap the emissive area EA and have a size smaller than or equal to that of the emissive area EA.

However, the arrangement position and size of the color filter pattern 150 may be determined by various factors such as a distance between the color filter pattern 150 and the first electrode 141, a distance between the color filter pattern 150 and a protruding portion PP and a depressed portion DP of a micro lens ML included in the overcoat layer 160, and a distance between an emissive area EA and another emissive area EA, as well as the size and position of the emissive area EA.

A pixel of the present disclosure may include one or more subpixels. For example, a single pixel may include two to four subpixels.

Subpixel refers to a unit in which a specific type of color filter pattern 150 is formed or in which a single light-emitting diode D is capable of emitting a particular color without the color filter pattern 150. A pixel generally includes two or more subpixels, each of a different color.

Colors defined in a subpixel may include red R, green G, blue B, and optionally white W, but embodiments are not limited thereto. A pixel will generally include at least one of a R, G and B subpixel, and optionally also a W subpixel, but embodiments are not limited thereto.

The overcoat layer 160 may be disposed on the color filter pattern 150 and the passivation layer 133.

The passivation layer 133 may be omitted. That is, the overcoat layer 160 may be disposed on the thin film transistor 120.

In the figure, the color filter pattern 150 is disposed on the passivation layer 133, but embodiments are not limited thereto. The color filter pattern 150 may be disposed on any position between the overcoat layer 160 and the substrate 110.

Particularly, in order to improve light extraction efficiency in the electroluminescent display device 100 according to the first embodiment of the present disclosure, the micro lens ML may be included in the overcoat layer 160 corresponding to the emissive area EA.

The micro lens ML may include a plurality of depressed portions DP and a plurality of protruding portions PP, but embodiments are not limited thereto, and the micro lens ML may have various other forms.

For example, a micro lens ML including protruding portions PP and connecting portions connecting adjacent protruding portions PP may also be formed in the overcoat layer 160. As a further example, the top surface of the overcoat layer 160 may be corrugated. The corrugated shape may be uniform with equally spacing and equal height in each protrusion along its entire length. Alternatively, it can be an uneven, asymmetrical, non-uniform or other type of corrugated shape.

The overcoat layer 160 serves as a planarizing layer in a region in which the plurality of depressed portions DP and the plurality of protruding portions PP are not disposed.

Each of the plurality of depressed portions DP may have various shapes in plan view, such as a hexagonal shape, a semicircular shape, a semielliptical shape, and a quadrilateral shape. In the embodiment in which the top surface is a corrugated shape, it can be fluted, which is preferred in one embodiment. It can be a non-uniform fluted shape, or it can be a diamond, square, triangle, curved, non-uniform or other corrugation.

The light-emitting diode D including the first electrode 141, the light-emitting layer 142, and the second electrode 143 may be disposed on the overcoat layer 160.

To block the spread of outgassing from the overcoat layer 160 to the light-emitting diode D, a second passivation layer (not illustrated) which has an insulating property may be disposed between the overcoat layer 160 and the first electrode 141.

That is, the second passivation layer which conforms to the morphology of the plurality of depressed portions DP and the plurality of protruding portions PP exactly may be disposed between the overcoat layer 160 and the first electrode 141.

Meanwhile, the first electrode 141 may be disposed on the overcoat layer 160.

In this case, the first electrode 141 may be an anode or cathode for supplying one of electrons or holes to the light-emitting layer 142.

A case in which the first electrode 141 of the electroluminescent display device 100 according to the first embodiment of the present disclosure is an anode will be described as an example.

The first electrode 141 may be formed of a conductive material having relatively high work function. For example, the first electrode 141 may be formed of a transparent conductive material such as indium-tin-oxide (ITO) and indium-zinc-oxide (IZO).

The first electrode 141 may be connected to the source electrode 123 of the thin film transistor 120 through a contact hole formed in the overcoat layer 160 and may be separately formed for each subpixel area.

Although the electroluminescent display device according to the first embodiment of the present disclosure has been described as an example in which the thin film transistor 120 is an N-type thin film transistor and the first electrode 141 is connected to the source electrode 123, embodiments are not limited thereto. When the thin film transistor 120 is a P-type thin film transistor, the first electrode 141 may be connected to the drain electrode 124.

The first electrode 141 may also be electrically connected to the light-emitting layer 142 by being in contact with the light-emitting layer 142 with a conductive material therebetween.

The first electrode 141 is disposed in a shape which follows, namely, conforms to the morphology of a surface of the overcoat layer 160.

That is, the first electrode 141 may be disposed in a form which conforms to the morphology of the plurality of depressed portions DP and the plurality of protruding portions PP of the overcoat layer 160 exactly.

A fully conformal layer has a uniform thickness at all places, regardless of the surface on which it is deposited, with the top surface of the fully conformal layer having the exact same shape as the top surface of the layer on which it is deposited. A partially conformal layer generally has a uniform thickness and its top surface generally has the same shape as the top surface on which it is deposited, but it may have slight variations in thickness at bends, corners, edges and depressions, steep slopes or step changes in the underlying surface on which it is deposited. Accordingly, in one embodiment, the first electrode is deposited as a fully conformal layer. In other embodiments, it might also be deposited as partially conformal layer, being slightly thicker in depressions and at the top of protrusions and somewhat thinner on steep slope surfaces between the depressions and protrusions.

A bank layer 136 may be disposed on the overcoat layer 160 and the first electrode 141.

The bank layer 136 may include an opening 136a exposing the first electrode 141.

The bank layer 136 may be disposed between adjacent pixel or subpixel areas and serve to differentiate the adjacent pixel or subpixel areas.

In this case, the plurality of depressed portions DP and the plurality of protruding portions PP of the overcoat layer 160 may be disposed in the opening 136a of the bank layer 136.

That is, since the plurality of depressed portions DP and the plurality of protruding portions PP of the overcoat layer 160 are disposed to overlap the color filter pattern 150, the plurality of depressed portions DP and the plurality of protruding portions PP of the overcoat layer 160 may overlap the color filter pattern 150, which is disposed thereunder, and overlap the opening 136a of the bank layer 136, which is disposed thereover.

The light-emitting layer 142 may be disposed on the exposed first electrode 141.

The light-emitting layer 142 may have a tandem white structure in which a plurality of light-emitting layers are stacked to emit white light.

For example, the light-emitting layer 142 may include a first light-emitting layer configured to emit blue light and a second light-emitting layer disposed on the first light-emitting layer and configured to emit light having a color which turns white when mixed with blue.

The second light-emitting layer may be a light-emitting layer configured to emit yellow-green light.

The light-emitting layer 142 may include only light-emitting layers that emit one of blue light, red light, and green light. In this case, the electroluminescent display device 100 may not include the color filter pattern 150.

Here, a luminescent material of the light-emitting layer 142 may be an organic luminescent material or an inorganic luminescent material such as a quantum dot.

Also, the light-emitting layer 142 may have a shape which conforms to the morphology of the overcoat layer 160.

The second electrode 143 for supplying one of electrons or holes to the light-emitting layer 142 may be disposed on the light-emitting layer 142.

In this case, the second electrode 143 may be an anode or a cathode.

A case in which the second electrode 143 of the electroluminescent display device 100 according to the first embodiment of the present disclosure is a cathode will be described as an example.

The second electrode 143 may be formed of a conductive material having relatively low work function and may be located substantially all over a display area. For example, the second electrode 143 may be formed of aluminum (Al), magnesium (Mg), silver (Ag), or an alloy thereof, but embodiments are not limited thereto.

The second electrode 143 may have a shape which conforms to the morphology of the overcoat layer 160. It may be a fully conformal layer or a partially conformal layer.

The first electrode 141, the light-emitting layer 142, and the second electrode 143 form the light-emitting diode D, and the light-emitting diode D conforms to the morphology of the plurality of depressed portions DP and the plurality of protruding portions PP of the overcoat layer 160.

The shape of the light-emitting diode D may be realized using the plurality of depressed portions DP and the plurality of protruding portions PP of the overcoat layer 160.

Accordingly, some of light emitted from the light-emitting layer 142, which has not been extracted to the outside due to being totally reflected inside the first electrode 141 and the light-emitting layer 142, may be made to travel at an angle smaller than a total reflection critical angle. In this way, external quantum efficiency may be improved through multiple reflections.

Figure 5A:
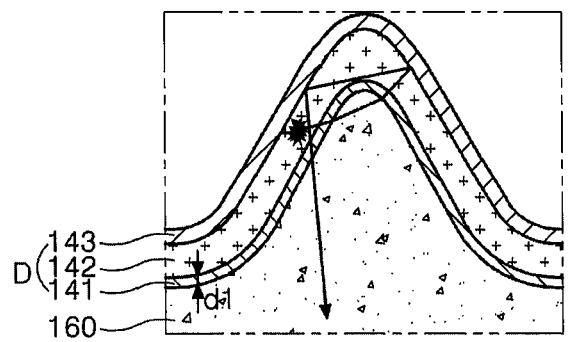
FIGS. 5A and 5B are views schematically illustrating an optical path in accordance with a thickness of a first electrode of the electroluminescent display device according to the first embodiment of the present disclosure.
Figure 5B:
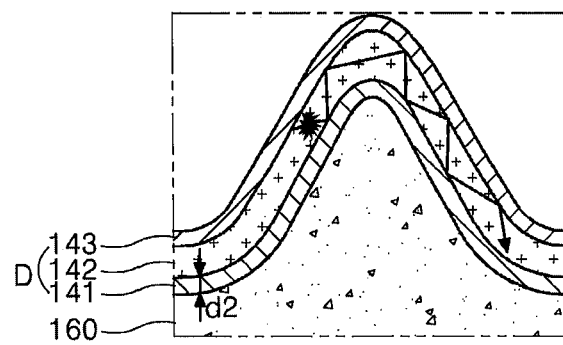

FIGS. 5A and 5B are views schematically illustrating an optical path in accordance with a thickness of a first electrode of the electroluminescent display device according to the first embodiment of the present disclosure. Description will be given with reference to FIGS. 5A and 5B along with FIG. 4.

FIG. 5A illustrates an optical path in a case in which a thickness d1 of the first electrode 141 is 250 Å, and FIG. 5B illustrates an optical path in a case in which a thickness d2 of the first electrode 141 is 500 Å.

Comparing FIGS. 5A and 5B, it can be seen that light emitted from an inclined surface of the light-emitting layer 142 is reflected at the second electrode 143, passes through the first electrode 141, and is extracted to the outside in the case of FIG. 5A in which the thickness d1 of the first electrode 141 is 250 Å. In the case of FIG. 5B in which the thickness d2 of the first electrode 141 is 500 Å, some of the light emitted from the inclined surface of the light-emitting layer 142 is totally reflected at the first electrode 141 and the second electrode 143 and thus not output to the outside.

That is, some of the light emitted from the light-emitting layer 142, which has not been able to be output to the outside due to being totally reflected inside the light-emitting diode D, may be output to the outside through the first electrode 141 in the case in which the first electrode 141 has the relatively thin thickness d1.

Figures 6, 7:
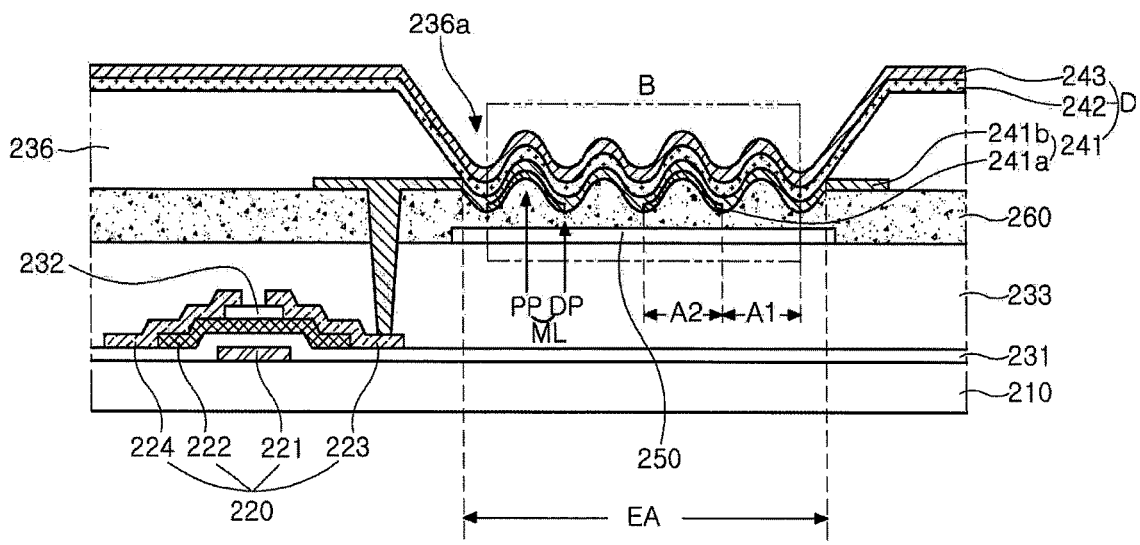
FIG. 6 is a table showing a driving voltage, a current-luminance efficiency, an external quantum efficiency, and a color temperature in accordance with a thickness of the first electrode of the electroluminescent display device according to the first embodiment of the present disclosure.
FIG. 7 is a cross-sectional view schematically illustrating an electroluminescent display device according to a second embodiment of the present disclosure.

FIG. 6 is a table showing a driving voltage, a current-luminance efficiency, an external quantum efficiency (EQE), and a color temperature in accordance with a thickness of the first electrode of the electroluminescent display device according to the first embodiment of the present disclosure. Description will be given with reference to FIG. 6 along with FIGS. 5A and 5B.

First, in terms of a driving voltage V, it can be seen that the driving voltage V is increased because the resistance increases with a decrease of the thickness of the first electrode 141.

That is, the driving voltage is 10.6 V when the thickness of the first electrode 141 is 400 Å, the driving voltage is 10.7 V when the thickness of the first electrode 141 is 300 Å, and the driving voltage is 10.8 V when the thickness of the first electrode 141 is 250 Å. From this, it can be seen that the driving voltage will be increased as the thickness of the first electrode 141 decreases to achieve the same effect on the light emitting layer 142. Next, in terms of current-luminance efficiency (cd/A) which indicates brightness for unit current, it can be seen that the current-luminance efficiency (cd/A) increases with a decrease of the thickness of the first electrode 141.

That is, the current-luminance efficiency (cd/A) is 109.8 cd/A when the thickness of the first electrode 141 is 400 Å, the current-luminance efficiency is 114.9 cd/A when the thickness of the first electrode 141 is 300 Å, and the current-luminance efficiency is 116.3 cd/A when the thickness of the first electrode 141 is 250 Å. From this, it can be seen that the current-luminance efficiency increases as the thickness of the first electrode 141 decreases.

In terms of external quantum efficiency (%), it can be seen that the external quantum efficiency (%) increases with a decrease of the thickness of the first electrode 141.

That is, the external quantum efficiency (%) is 45.2% when the thickness of the first electrode 141 is 400 Å, the external quantum efficiency is 47.2% when the thickness of the first electrode 141 is 300 Å, and the external quantum efficiency is 48% when the thickness of the first electrode 141 is 250 Å. From this, it can be seen that the external quantum efficiency increases as the thickness of the first electrode 141 decreases.

Lastly, in terms of a color temperature or correlated color temperature (CCT (K)) which expresses chromaticity of a light source or a reference white color with a temperature of the closest area on a radial curve instead of coordinates on the two-dimensional chromaticity diagram, it can be seen that the color temperature decreases with a decrease of the thickness of the first electrode 141.

That is, the correlated color temperature (CCT(K)) is 7018 K when the thickness of the first electrode 141 is 400 Å, the color temperature is 6965 K when the thickness of the first electrode 141 is 300 Å, and the color temperature is 6782 K when the thickness of the first electrode 141 is 250 Å. From this, it can be seen that the color temperature decreases as the thickness of the first electrode 141 decreases.

As described above, the external quantum efficiency (%) and current-luminance efficiency (cd/A) of the electroluminescent display device 100 of FIG. 3 according to the first embodiment of the present disclosure may be improved by forming the thickness of the first electrode 141 to be in a range of 250 Å to 300 Å.

However, since the driving voltage V is increased with an increase of resistance when the thickness of the first electrode 141 is formed to be in the range of 250 Å to 300 Å. Accordingly, there is some chance that the reliability of the electroluminescent display device 100 of FIG. 3 might be degraded.

Hereinafter, an electroluminescent display device 100 of FIG. 3 capable of preventing an increase in resistance while improving external quantum efficiency (%) and current-luminance efficiency (cd/A) will be described according to a second embodiment.

Second Embodiment

Hereinafter, detailed description of configurations identical or similar to those of the first embodiment may be omitted.

FIG. 7 is a cross-sectional view schematically illustrating an electroluminescent display device according to a second embodiment of the present disclosure.

As illustrated in FIG. 7, an electroluminescent display device 200 according to a second embodiment of the present disclosure includes a substrate 210, a thin film transistor 220, a color filter pattern 250, an overcoat layer 260, and a light-emitting diode D electrically connected to the thin film transistor 220.

The thin film transistor 220 may include a gate electrode 221, an active layer 222, a source electrode 223, and a drain electrode 224.

Specifically, the gate electrode 221 of the thin film transistor 220 and a gate insulating layer 231 may be disposed on the substrate 210.

The active layer 222 which overlaps the gate electrode 221 may be disposed on the gate insulating layer 231.

An etch stopper 232 for protecting a channel region of the active layer 222 may be disposed on the active layer 222.

The source electrode 223 and the drain electrode 224 may be disposed on the active layer 222 and contact the active layer 122.

A passivation layer 233 may be disposed on the drain electrode 224 and the source electrode 223, and the color filter pattern 250 may be disposed on the passivation layer 233.

The overcoat layer 260 may be disposed on the color filter pattern 250 and the passivation layer 233.

In order to improve light extraction efficiency in the electroluminescent display device 200 according to the second embodiment of the present disclosure, the micro lens ML may be included in the overcoat layer 260 corresponding to the emissive area EA.

The micro lens ML may include a plurality of depressed portions DP and a plurality of protruding portions PP, but embodiments are not limited thereto, and the micro lens ML may have various other forms.

For example, a micro lens ML including protruding portions PP and connecting portions connecting adjacent protruding portions PP may also be formed in the overcoat layer 260.

The overcoat layer 260 serves as a planarizing layer in an area in which the plurality of depressed portions DP and the plurality of protruding portions PP are not disposed. For example, the overcoat layer 260 in a non-emissive area may have a flat top surface.

Each of the plurality of depressed portions DP may have various shapes in plan view, such as a hexagonal shape, a semicircular shape, a semielliptical shape, and a quadrilateral shape.

The micro lens ML including the depressed portions DP and the protruding portions PP may be formed through a photolithography process using a mask including a light-blocking portion and a light-transmitting portion. The light-transmitting portion may correspond to the depressed portions DP and the light-blocking portion may correspond to the protruding portions PP, but embodiments are not limited thereto. Alternatively, the light-transmitting portion may correspond to the protruding portions PP and the light-blocking portion may correspond to the depressed portions DP.

The overcoat layer 260 may be formed of an organic material having a refractive index in a range of about 1.5 to 1.55, but embodiments are not limited thereto.

The light-emitting diode D including a first electrode 241, a light-emitting layer 242, and a second electrode 243 may be disposed on the overcoat layer 260.

In this case, the first electrode 241 may be an anode or cathode for supplying one of electrons or holes to the light-emitting layer 242.

A case in which the first electrode 241 of the electroluminescent display device 200 according to the second embodiment of the present disclosure is an anode will be described as an example.

The first electrode 241 may be formed of a conductive material having relatively high work function. For example, the first electrode 241 may be formed of a transparent conductive material such as ITO and IZO.

Particularly, the first electrode 241 of the electroluminescent display device 200 according to the second embodiment of the present disclosure may be disposed to not fully conform to a shape of a top surface of the overcoat layer 260 and may be formed to have different thicknesses in each region of an emissive area EA.

That is, the first electrode 241 may include a first region A1 having a first thickness and a second region A2 having a second thickness which is greater than the first thickness.

For example, the first region A1 of the first electrode 241 may be formed of an electrode layer 241b, and the second region A2 of the first electrode 241 may include an electrode layer 241b and an electrode pattern 241a disposed thereunder.

Accordingly, the first electrode 241 may be formed to have different thicknesses in each of the first and second regions A1 and A2, and through such a structure, an increase in resistance may be prevented while the external quantum efficiency (%) and current-luminance efficiency (cd/A) are improved. In a preferred embodiment, each region A1 has the same thickness as all regions A1 in the subpixel and each region A2 has the same thickness as all regions A2 in the subpixel.

Although the first electrode 241 has been described as being formed to have different thicknesses in each of the respective first and second regions A1 and A2, embodiments are not limited thereto. The first electrode 241 may be formed to have different thicknesses in each of a plurality of regions, which includes more than two regions.

The thickness of the first electrode 241 in each of the first and second regions A1 and A2 will be described in more detail below.

The first electrode 241 may be connected to the source electrode 223 of the thin film transistor 220 through a contact hole formed in the overcoat layer 260 and may be separately formed for each pixel area.

The first electrode 241 is disposed to follow the morphology of a surface of the overcoat layer 260.

That is, the first electrode 241 may have different thicknesses in each of the first and second region A1 and A2 and be disposed in a form which follows the morphology of the plurality of depressed portions DP and the plurality of protruding portions PP of the overcoat layer 260 exactly.

In addition, the first electrode 241 may have a refractive index of about 1.8 or higher, but embodiments are not limited thereto.

A bank layer 236 may be disposed on the overcoat layer 260 and the first electrode 241.

The bank layer 236 may include an opening 236a exposing the first electrode 241.

The bank layer 236 may be disposed between adjacent pixel or subpixel areas and serve to differentiate the adjacent pixel or subpixel areas.

In this case, the plurality of depressed portions DP and the plurality of protruding portions PP of the overcoat layer 260 may be disposed in the opening 236a of the bank layer 236.

That is, since the plurality of depressed portions DP and the plurality of protruding portions PP of the overcoat layer 260 are disposed to overlap the color filter pattern 250, the plurality of depressed portions DP and the plurality of protruding portions PP of the overcoat layer 260 may overlap the color filter pattern 250, which is disposed thereunder, and overlap the opening 236a of the bank layer 236, which is disposed there over.

The bank layer 236 may be formed of a photo acrylic organic material having a refractive index of 1.6 or lower, but embodiments are not limited thereto.

The light-emitting layer 242 may be disposed on the first electrode 241.

The light-emitting layer 242 may have a shape that is fully conformal to the morphology of the first electrode 241.

The second electrode 243 for supplying one or electrons or holes to the light-emitting layer 242 may be disposed on the light-emitting layer 242.

Here, the second electrode 243 may be an anode or a cathode.

A case in which the second electrode 243 of the electroluminescent display device 200 according to the second embodiment of the present disclosure is a cathode will be described as an example.

The second electrode 243 may be formed of a conductive material having relatively low work function and may be located substantially all over a display area. For example, the second electrode 243 may be formed of Al, Mg, Ag, or an alloy thereof, but embodiments are not limited thereto.

The second electrode 243 may have a shape which is fully conformal to the morphology of the light-emitting layer 242.

As described above, the first electrode 241 having different thicknesses for each region, the light-emitting layer 242, and the second electrode 243 form the light-emitting diode D, and the light-emitting diode D is conformal to the morphology of the plurality of depressed portions DP and the plurality of protruding portions PP of the overcoat layer 260.

Figure 8:
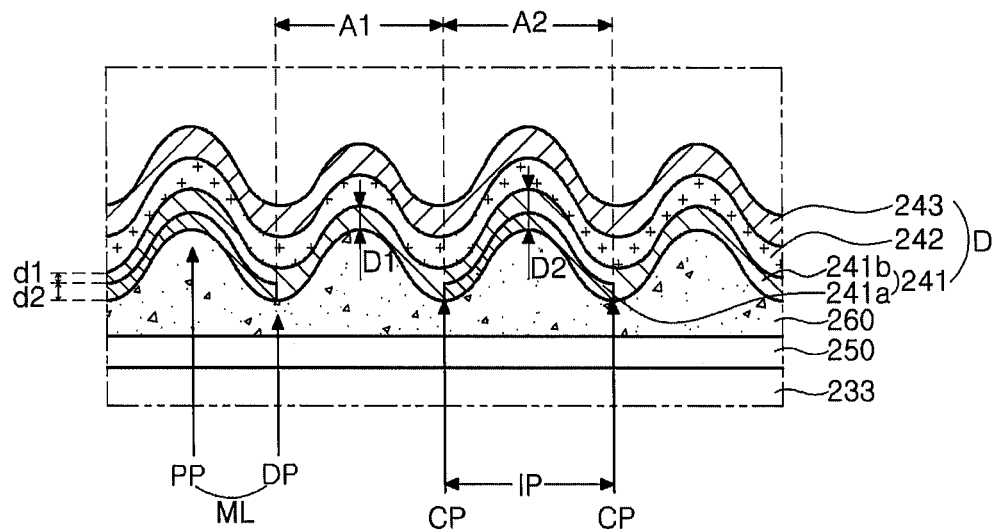
FIG. 8 is an enlarged view of portion B of FIG. 7.

FIG. 8 is an enlarged view of portion B of FIG. 7.

As illustrated in FIG. 8, the electroluminescent display device 200 of FIG. 7 according to the second embodiment of the present disclosure includes the passivation layer 233, the color filter pattern 250 disposed on the passivation layer 233, the overcoat layer 260 disposed on the color filter pattern 250, and the light-emitting diode D disposed on the overcoat layer 260.

Here, a micro lens ML may be included in the overcoat layer 260.

The micro lens ML may include a plurality of depressed portions DP and a plurality of protruding portions PP.

Particularly, the first electrode 241 of the electroluminescent display device 200 according to the second embodiment of the present disclosure may be disposed along a top surface of the overcoat layer 260 in the emissive area EA of FIG. 7 and may be formed to have different thicknesses in each region of the emissive area EA.

That is, the first electrode 241 may have different thicknesses in each region and not be fully conformal to the morphology of the plurality of depressed portions DP and the plurality of protruding portions PP of the overcoat layer 260 exactly. For example, the first electrode 241 may include a first region A1 having a first thickness D1 and a second region A2 having a second thickness D2 which is greater than the first thickness D1.

In this case, the first region A1 of the first electrode 241 may be formed of a single layer, and the second region A2 of the first electrode 241 may be formed of multiple layers.

For example, the first region A1 of the first electrode 241 may be formed of an electrode layer 241b, and the second region A2 of the first electrode 241 may include an electrode layer 241b and an electrode pattern 241a disposed thereunder.

That is, by forming the electrode pattern 241a in a region corresponding to the second region A2 on the overcoat layer 260 and forming the electrode layer 241b which covers the overcoat layer 260 and the electrode pattern 241a, the second region A2, in which the electrode pattern 241a and the electrode layer 241b overlap each other on the overcoat layer 260, and the first region A1, in which only the electrode layer 241b is disposed on the overcoat layer 260, may be formed.

For example, when a range from a central point CP of a depressed portion DP to a central point CP of another depressed portion DP adjacent thereto is defined as an individual pattern IP of the micro lens ML, the first region A1 and the second region A2 may be alternately disposed for each individual pattern IP. However, this is merely an example, and the first region A1 and the second region A2 may also be alternately disposed for every two individual patterns IP.

Also, the second region A2 may be disposed in two individual patterns IP, and the first region A1 may be disposed in a single individual pattern IP such that the first region A1 and the second region A2 are alternately disposed. Alternatively, the first region A1 may be disposed in two individual patterns IP, and the second region A2 may be disposed in a single individual pattern IP such that the first region A1 and the second region A2 are alternately disposed.

The second region A2 may also be disposed in a portion of an individual pattern IP. For example, the second region A2 may be disposed in a depressed portion DP or protruding portion PP of the micro lens ML, or the second region A2 may also be disposed in an region configured to connect the depressed portion DP and the protruding portion PP.

That is, positions at which the first region A1 and the second region A2 of the first electrode 241 are disposed may be changed in various ways.

In one embodiment of FIGS. 7 and 8, the thickness d1 of the electrode layer 241b of the first electrode 241 may be in a range of 50 Å to 200 Å, and the thickness d2 of the electrode pattern 241a of the first electrode 241 may be in a range of 200 Å to 350 Å but embodiments are not limited thereto.

As a result, a thickness D1 of the first region A1 of the first electrode 241 may be in a range of 50 Å to 200 Å, and a thickness D2 of the second region A2 of the first electrode 241 may be in a range of 250 Å to 550 Å, but embodiments are not limited thereto.

Although the electrode pattern 241a is illustrated in FIG. 8 as being formed as a single layer below the electrode layer 241b, embodiments are not limited thereto, and the electrode pattern 241a may also be formed as multiple layers.

The electrode layer 241b and the electrode pattern 241a disposed below the electrode layer 241b may be formed of the same material. For example, the electrode layer 241b and the electrode pattern 241a disposed below the electrode layer 241b may be formed of a transparent conductive material such as ITO and IZO.

Figure 9:
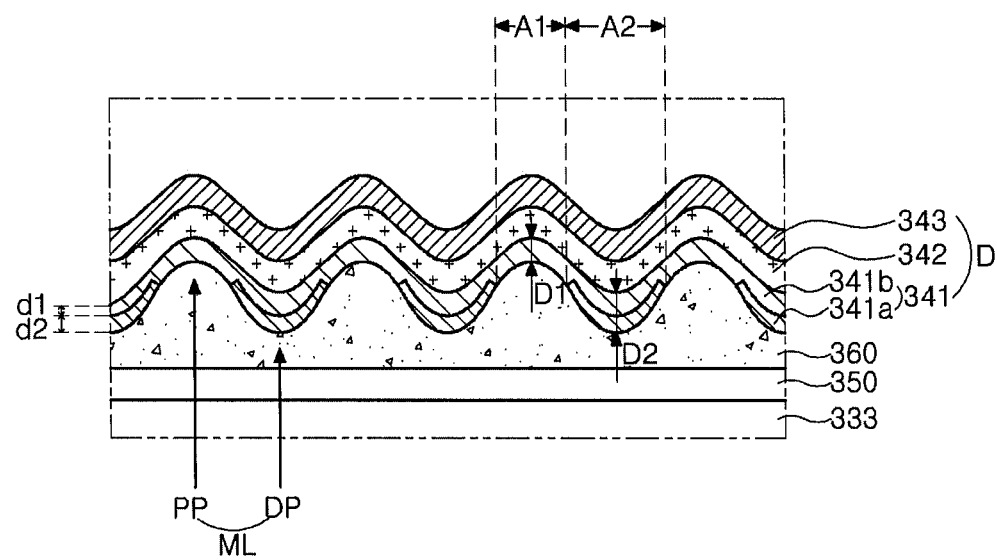
FIG. 9 is a cross-sectional view schematically illustrating a first modified example of the electroluminescent display device according to the second embodiment of the present disclosure.

It can be considered that electrode pattern 241a is a first sublayer of the first electrode and that electrode layer 241b is the first electrode layer itself since it is continuous. Thus, viewing FIGS. 7 and 8, it can be considered that layer 241a is a first electrode sublayer disposed at selected locations below the first electrode layer. In one embodiment, the first electrode sublayer 241a is positioned only on each protrusion of the overcoat layer and is not positioned in some portions of bottom region of the depressions in one embodiment. In another embodiment, as can be seen in FIGS. 7 and 8, the first electrode sublayer is positioned only the top region of selected ones of the protrusions of the overcoat layer and is not positioned on the non-selected ones of the protrusions of the overcoat layer. In this embodiment, the first electrode sublayer 241a is maintained only on every other protrusion. In the embodiment of FIG. 9, the first electrode sublayer 241a is positioned only in the depressed portions of the overcoat layer and is not positioned on the protrusions.

In a method of forming the first electrode 241, a transparent conductive material such as ITO and IZO is deposited on the overcoat layer 260 through sputtering or the like.

Then, the transparent conductive material in a region corresponding to the first region A1 is removed by a pattern and etch sequence or other technique to thereby form the electrode pattern 241a at some locations and exposing the overcoat layer 260 at other locations which corresponds to the first region A1.

Next, a transparent conductive material such as ITO and IZO is deposited as a conformal layer on the overcoat layer 260 and the electrode pattern 241a through sputtering or the like so as to form the electrode layer 241b.

Accordingly, the second region A2, in which the electrode pattern 241a and the electrode layer 241b overlap each other on the overcoat layer 260, and the first region A1, in which only the electrode layer 241b is disposed on the overcoat layer 260, may be formed.

As described above, the first electrode 241 having different thicknesses D1 and D2 for the first and second regions A1 and A2 may be formed by the electrode layer 241b and the electrode pattern 241a in the electroluminescent display device 200 of FIG. 7 according to the second embodiment of the present disclosure.

Through such a structure, reliability of the electroluminescent display device 200 of FIG. 7 may be improved by preventing an increase in resistance through the second region A2 while improving the external quantum efficiency (%) and the current-luminance efficiency (cd/A) through the first region A1.

Further, the correlated color temperature may be adjusted depending on the thicknesses D1 and D2 of the first region A1 and the second region A2.

FIG. 9 is a cross-sectional view schematically illustrating a first modified example of the electroluminescent display device according to the second embodiment of the present disclosure. Detailed description of configurations identical or similar to those of the second embodiment will be omitted.

As illustrated in FIG. 9, the first modified example of the electroluminescent display device 200 of FIG. 7 according to the second embodiment of the present disclosure may include a passivation layer 333, a color filter pattern 350 disposed on the passivation layer 333, an overcoat layer 360 disposed on the color filter pattern 350, and a light-emitting diode D disposed on the overcoat layer 360.

In this case, a micro lens ML may be included in the overcoat layer 360.

The micro lens ML may include a plurality of depressed portions DP and a plurality of protruding portions PP.

Particularly, a first electrode 341 of the first modified example of the electroluminescent display device 200 of FIG. 7 according to the second embodiment of the present disclosure may be disposed to conform to a shape of a top surface of the overcoat layer 360 in an emissive area EA and may be formed to have different thicknesses in each region of the emissive area EA of FIG. 7.

That is, the first electrode 341 may have different thicknesses in first and second regions A1 and A2, and the first electrode 341 may be disposed in a conformal layer which follows the morphology of the plurality of depressed portions DP and the plurality of protruding portions PP of the overcoat layer 360 exactly.

The first electrode 341 may include the first region A1 having a first thickness D1 and the second region A2 having a second thickness D2 which is greater than the first thickness D1.

In this case, the first region A1 of the first electrode 341 may be formed of a single layer, and the second region A2 of the first electrode 341 may be formed of multiple layers.

For example, the first region A1 of the first electrode 341 may be formed of an electrode layer 341b, and the second region A2 of the first electrode 341 may include an electrode layer 341b and an electrode pattern 341a disposed below the electrode layer 341b.

Particularly, in the first electrode 341 of the first modified example of the electroluminescent display device 200 of FIG. 7 according to the second embodiment of the present disclosure, the first region A1 may be disposed corresponding to the protruding portions PP of the micro lens ML of the overcoat layer 360, and the second region A2 may be disposed corresponding to the depressed portions DP.

In this case, a thickness d1 of the electrode layer 341b of the first electrode 341 may be in a range of 50 Å to 200 Å, and a thickness d2 of the electrode pattern 341a of the first electrode 341 may be in a range of 200 Å to 350 Å, but embodiments are not limited thereto.

The thickness D1 of the first region A1 of the first electrode 341 may be in a range of 50 Å to 200 Å, and the thickness D2 of the second region A2 of the first electrode 341 may be in a range of 250 Å to 550 Å, but embodiments are not limited thereto.

Although the electrode pattern 341a is illustrated in FIG. 9 as being formed as a single layer below the electrode layer 341b, embodiments are not limited thereto, and the electrode pattern 341a may also be formed as multiple layers.

The electrode layer 341b and the electrode pattern 341a disposed below the electrode layer 341b may be formed of the same material. For example, the electrode layer 341b and the electrode pattern 341a disposed below the electrode layer 341b may be formed of a transparent conductive material such as ITO and IZO.

Accordingly, the second region A2, in which the electrode pattern 341a and the electrode layer 341b overlap each other on the overcoat layer 360, and the first region A1, in which only the electrode layer 341b is disposed on the overcoat layer 360, may be formed.

Particularly, in the first electrode 341 of the first modified example of the electroluminescent display device 200 of FIG. 7 according to the second embodiment, the first region A1 having a small thickness may be disposed corresponding to the protruding portions PP of the micro lens ML of the overcoat layer 360, and the second region A2 having a large thickness may be disposed corresponding to the depressed portions DP.

Through such a structure, an increase in resistance may be effectively prevented by disposing the second region A2 of the first electrode 341 in a region other than a main emissive area of the light-emitting diode D while further improving the external quantum efficiency (%) and the current-luminance efficiency (cd/A) by disposing the first region A1 of the first electrode 341 in an region which corresponds to the main emissive area of the light-emitting diode D. This can be accomplished using the same layer deposit then pattern and etch steps described with respect to FIGS. 7 and 8.

Figure 10:
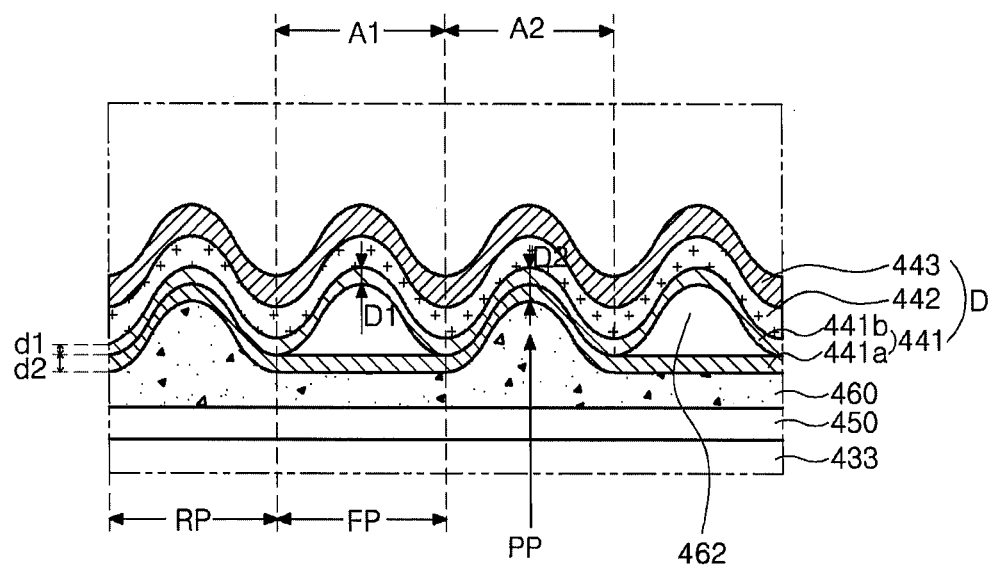
FIG. 10 is a cross-sectional view schematically illustrating a second modified example of the electroluminescent display device according to the second embodiment of the present disclosure.

FIG. 10 is a cross-sectional view schematically illustrating a second modified example of the electroluminescent display device according to the second embodiment of the present disclosure. Detailed description of configurations identical or similar to those of the second embodiment will be omitted.

As illustrated in FIG. 10, the second modified example of the electroluminescent display device 200 of FIG. 7 according to the second embodiment of the present disclosure may include a passivation layer 433, a color filter pattern 450 disposed on the passivation layer 433, an overcoat layer 460 disposed on the color filter pattern 450, and a light-emitting diode D disposed on the overcoat layer 460.

In this case, a micro lens ML may be included in the overcoat layer 460.

The micro lens ML may include a plurality of protruding portions PP.

In this case, the plurality of protruding portions PP may be disposed to be spaced apart from each other.

Particularly, a first electrode 441 of the second modified example of the electroluminescent display device 200 of FIG. 7 according to the second embodiment of the present disclosure may include a first electrode layer 441a and a second electrode layer 441b.

In this case, the first electrode layer 441a of the first electrode 441 may be disposed along a shape of a top surface of the overcoat layer 460 in the emissive area EA of FIG. 7.

That is, the first electrode layer 441a may include round portions RP which correspond to the plurality of protruding portions PP of the overcoat layer 460 and flat portions FP which correspond to regions in which the plurality of protruding portions PP are spaced apart from each other.

An insulating pattern 462 may be formed on the flat portions FP of the first electrode layer 441a.

That is, the insulating pattern 462 may be formed corresponding to the regions in which the plurality of protruding portions PP of the micro lens are spaced apart from each other.

For example, in plan view, the first electrode layer 441a may be disposed substantially on an entire surface of the top of the micro lens in which the plurality of protruding portions PP are formed to be spaced apart from each other, the insulating pattern 462 may be disposed in the form of an island corresponding to the regions in which the plurality of protruding portions PP of the micro lens ML are spaced apart from each other on the first electrode layer 441a, and the second electrode layer 441b configured to cover the insulating pattern 462 and the first electrode layer 441a may be disposed thereon.

Here, although the insulating pattern 462 may be formed to have the same size as that of the plurality of protruding portions PP of the micro lens, embodiments are not limited thereto. The insulating pattern 462 may be formed to have a size smaller than that of the plurality of protruding portions PP of the micro lens or formed to have a size greater than that of the plurality of protruding portions PP of the micro lens.

In this case, the insulating pattern 462 may be formed of the same material as that of the bank layer 236 of FIG. 7.

That is, since the insulating pattern 462 may be formed on the flat portions FP of the first electrode 441 by using a process of forming the bank layer 236 of FIG. 7 without going through a separate process, a separate process is not required. For example, the bank layer 236 of FIG. 7 and the insulating pattern 462 may be formed using a transflective mask.

The second electrode layer 441b may be disposed to cover the round portions RP of the first electrode layer 441a of the first electrode 441 and the top of the insulating pattern 462.

Accordingly, the first electrode 441 which is in contact with the light-emitting layer 442 may include a first region A1 having a first thickness D1 and a second region A2 having a second thickness D2 which is greater than the first thickness D1.

In this case, the first region A1 of the first electrode 441 may be formed of the second electrode layer 441b, and the second region A2 of the first electrode 441 may include the second electrode layer 441b and the round portions RP of the first electrode layer 441a which is in contact with the second electrode layer 441b.

The thickness d1 of the second electrode layer 441b of the first electrode 441 may be in a range of 50 Å to 200 Å, and the thickness d2 of the first electrode layer 441a of the first electrode 441 may be in a range of 200 Å to 350 Å, but embodiments are not limited thereto.

The first thickness D1 of the first region A1 of the first electrode 441 may be in a range of 50 Å to 200 Å, and the thickness D2 of the second region A2 of the first electrode 441 may be in a range of 250 Å to 550 Å, but embodiments are not limited thereto.

In this case, the first electrode layer 441a and the second electrode layer 441b may be formed of the same material. For example, the first electrode layer 441a and the second electrode layer 441b may be formed of a transparent conductive material such as ITO and IZO.

Through such a structure, reliability of the electroluminescent display device 200 of FIG. 7 may be improved by preventing an increase in resistance through the second region A2 while improving the external quantum efficiency (%) and the current-luminance efficiency (cd/A) through the first region A1.

Further, the correlated color temperature may be adjusted through the thicknesses D1 and D2 of the first region A1 and the second region A2.

Particularly, by disposing the insulating pattern 462, which is formed of the same material as that of the bank layer 236 of FIG. 7, between the first electrode layer 441a and the second electrode layer 441b in the first electrode 441 of the second modified example of the electroluminescent display device 200 of FIG. 7 according to the second embodiment of the present disclosure, the first electrode 441 having different thicknesses D1 and D2 for the regions A1 and A2 may be realized without going through a separate process. In this way, a process may be simplified.

Further, since a service life of the light-emitting diode D decreases with an increase of an amount of the overcoat layer 460 due to outgassing of the light-emitting diode D, the insulating pattern 462 is disposed between the plurality of protruding portions PP of the overcoat layer 460 in the second modified example of the second embodiment of the present disclosure. In this way, since the absolute amount of the overcoat layer 460 may be decreased, the service life of the light-emitting diode D may be increased. In the embodiment of FIG. 10, the first electrode 441 has the combined thickness of d1 and d2 for its entire length, providing low resistance, however on top of some protrusions 462, only layer 441b is present and layer 441a is flat while on the top of other protrusions in overcoat layer 460, both layer 441a and 441b are present, thus this structure provides different properties for light reflection at different locations in the ML as has been discussed. In the present disclosure, an overcoat layer having a micro lens is disposed so that light extraction efficiency can be improved.

Further, a first electrode, which has a first thickness and a second thickness, is disposed on the overcoat layer so that the light extraction efficiency can be further improved without an increase in resistance.

The present disclosure has been described above with reference to exemplary embodiments thereof. However, those of ordinary skill in the art should understand that various modifications and changes may be made to the present disclosure within the scope not departing from the technical spirit and scope of the present disclosure described in the claims below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate;
a thin film transistor disposed on the substrate;
an overcoat layer disposed on the thin film transistor; and
a light-emitting diode electrically connected to the thin film transistor through the overcoat layer,
wherein the light-emitting diode includes a first electrode on the overcoat layer, a light-emitting layer on the first electrode and a second electrode on the light-emitting layer, and an emissive area is an area in which the light-emitting layer emits light by the first electrode or the second electrode,
wherein the overcoat layer includes a micro lens at a position corresponding to the emissive area, and the light-emitting diode conforms to a morphology of the micro lens,
wherein the first electrode on the overcoat layer includes a first region and a second region, the first region comprises an electrode layer, and the second region includes the electrode layer and an electrode pattern disposed between the electrode layer and the overcoat layer,
wherein the second region of the first electrode has a multiple-layered structure, and
wherein the electrode layer and the electrode pattern are formed of a same conductive material.

2. The electroluminescent display device according to claim 1, further including a color filter pattern, wherein the color filter pattern is located under the overcoat layer and at a position corresponding to the emissive area, and light from the light-emitting layer is output to the outside through the first electrode.

3. The electroluminescent display device according to claim 1, further including a color filter pattern, wherein the color filter pattern is located on the light-emitting diode and at a position corresponding to the emissive area, light from the light-emitting layer is output to the outside through the second electrode, and the overcoat layer is under the light-emitting diode.

4. The electroluminescent display device according to claim 1, wherein the micro lens includes a plurality of protruding portions and a plurality of depressed portions, or a plurality of protruding portions and a plurality of connecting portions connecting adjacent protruding portions.

5. The electroluminescent display device according to claim 4, wherein a range from a central point of one depressed portion to a central point of another depressed portion adjacent thereto is one individual pattern of the micro lens, and the first region and the second region are alternately disposed for each or several individual patterns.

6. The electroluminescent display device according to claim 4, wherein a range from a central point of one depressed portion to a central point of another depressed portion adjacent thereto is one individual pattern of the micro lens, and the first region and the second region are disposed in several individual patterns or in a portion of one individual pattern.

7. The electroluminescent display device according to claim 1, wherein a thickness of the electrode layer is in a range of 50 Å to 200 Å, and a thickness of the electrode pattern is in a range of 200 Å to 350 Å.

8. The electroluminescent display device according to claim 1, wherein the electrode layer and the electrode pattern are formed of a same transparent conductive material.

9. The electroluminescent display device according to claim 4, wherein the first region corresponds to the protruding portions, and the second region corresponds to the depressed portions or the connecting portions, or
wherein the first region corresponds to the depressed portions or the connecting portions, and the second region corresponds to the protruding portions.

10. The electroluminescent display device according to claim 1, wherein a bank layer is disposed on the first electrode, the bank layer includes an opening exposing the first electrode, and the micro lens is disposed in the opening,
wherein the first electrode further includes a third region, and the second region has a thickness larger than the first region and smaller than the third region, and
wherein the third region contacts a drain electrode of the thin film transistor.

11. An electroluminescent display device, comprising:
a substrate;
a thin film transistor disposed on the substrate;
an overcoat layer disposed on the thin film transistor; and
a light-emitting diode electrically connected to the thin film transistor through the overcoat layer,
wherein the light-emitting diode includes a first electrode on the overcoat layer, a light-emitting layer on the first electrode and a second electrode on the light-emitting layer, and an emissive area is an area in which the light-emitting layer emits light by the first electrode or the second electrode,
wherein the overcoat layer includes a micro lens at a position corresponding to the emissive area, and the light-emitting diode conforms to a morphology of the micro lens,
wherein the first electrode on the overcoat layer includes a first region having a first thickness and a second region having a second thickness larger than the first thickness,
wherein the micro lens includes a plurality of protruding portions and a plurality of depressed portions, a range from a central point of one depressed portion to a central point of another depressed portion adjacent thereto is one individual pattern of the micro lens, and the first region and the second region are alternately disposed for each or several individual patterns,
wherein the second region of the first electrode has a multiple-layered structure including a first layer and a second layer, and
wherein the first layer and the second layer are formed of a same conductive material.

12. The electroluminescent display device according to claim 11, further including a color filter pattern, wherein the color filter pattern is located under the overcoat layer and at a position corresponding to the emissive area, and light from the light-emitting layer is output to the outside through the first electrode.

13. The electroluminescent display device according to claim 11, further including a color filter pattern, wherein the color filter pattern is located on the light-emitting diode and at a position corresponding to the emissive area, light from the light-emitting layer is output to the outside through the second electrode, and the overcoat layer is under the light-emitting diode.

14. The electroluminescent display device according to claim 11, wherein the first region comprises an electrode layer, and the second region includes the electrode layer as the first layer and an electrode pattern disposed between the electrode layer and the overcoat layer as the second layer.

15. The electroluminescent display device according to claim 14, wherein a thickness of the electrode layer is in a range of 50 Å to 200 Å, and a thickness of the electrode pattern is in a range of 200 Å to 350 Å.

16. The electroluminescent display device according to claim 11, wherein the first layer and the second layer are formed of a same transparent conductive material.

17. The electroluminescent display device according to claim 11, wherein the first electrode include a first electrode layer and a second electrode layer on the first electrode layer, the first electrode layer includes round portions which correspond to the plurality of individual patterns spaced apart from each other and flat portions which correspond to regions in which the plurality of individual patterns are spaced apart from each other, an insulating pattern is formed between the flat portions and the second electrode layer, the first region includes the second electrode layer, and the second region includes the second electrode layer and the round portions which is in contact with the second electrode layer.

18. The electroluminescent display device according to claim 17, wherein a bank layer is disposed on the first electrode, the bank layer includes an opening exposing the first electrode, and the micro lens is disposed in the opening.

19. The electroluminescent display device according to claim 18, wherein the insulating pattern and the bank layer are formed of a same material.

20. The electroluminescent display device according to claim 11, wherein the first electrode further includes a third region having a third thickness, and the second thickness is larger than the first thickness and smaller than the third thickness, and wherein the third region contacts a drain electrode of the thin film transistor.

* * * * *